United States Patent
Takeuchi et al.

(10) Patent No.: US 6,518,690 B2
(45) Date of Patent: Feb. 11, 2003

(54) PIEZOELECTRIC/ELECTROSTRICTIVE FILM TYPE ELEMENTS AND PROCESS FOR PRODUCING THE SAME

(75) Inventors: Yukihisa Takeuchi, Nagoya (JP); Tsutomu Nanataki, Nagoya (JP); Koji Kimura, Nagoya (JP); Masao Takahashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/837,546

(22) Filed: Apr. 18, 2001

(65) Prior Publication Data

US 2002/0014816 A1 Feb. 7, 2002

(30) Foreign Application Priority Data

Apr. 19, 2000 (JP) ........................................ 2000-118030

(51) Int. Cl.⁷ ............................................. H01L 41/187
(52) U.S. Cl. ....................................................... 310/358
(58) Field of Search ......................................... 310/358

(56) References Cited

U.S. PATENT DOCUMENTS

| 6,091,182 A | 7/2000 | Takeuchi et al. ............ 310/330 |
| 6,265,811 B1 | 7/2001 | Takeuchi et al. ............ 310/330 |
| 6,297,578 B1 | 10/2001 | Takeuchi et al. ............ 310/330 |
| 6,387,712 B1 * | 5/2002 | Yano et al. .................... 438/3 |

FOREIGN PATENT DOCUMENTS

| EP | 0 984 252 A2 | 3/2000 | ............ G01G/3/13 |
| JP | 03-128681 | 5/1991 | ............ H02N/2/00 |
| JP | 05-029675 | 2/1993 | ............ H01L/41/09 |
| JP | 05-049270 | 2/1993 | ............ H02N/2/00 |
| JP | 05-097437 | 4/1993 | ............ C01G/25/00 |
| JP | 05-270912 | 10/1993 | ............ C04B/35/48 |

OTHER PUBLICATIONS

Anzai, Kazuo, "Denki Kagaku", vol. 53, No. 1 (1985), pp.63–68, 12/85.
Uchino, Kenji, "Piezoelectric/Electrostrictive Actuators: Fundamental to Applied Techniques", ISBN 4–627–77120–7, 8/88.
U.S. patent application Ser. No. 10/230,772, Takeuchi et al., filed Aug. 29, 2002.
U.S. patent application Ser. No. 10/230,731, Takeuchi et al., filed Aug. 29, 2002.
U.S. patent application Ser. No. 10/225,946, Takeuchi et al., filed Aug. 22, 2002.
U.S. patent application Ser. No. 10/265,933 claims only Takeuchi et al., filed Oct. 7, 2002.

* cited by examiner

Primary Examiner—Thomas M. Dougherty
(74) Attorney, Agent, or Firm—Burr & Brown

(57) ABSTRACT

An integrated piezoelectric/electrostrictive film type element with excellent durability, includes a substrate made of a ceramic material composed mainly of completely stabilized or partially stabilized zirconium oxide, and a piezoelectric/electrostrictive operating section integrated onto the ceramic substrate by a film-forming method, the piezoelectric/electrostrictive operating section comprising a lower electrode, a piezoelectric/electrostrictive layer of a lead element-containing composition, and an upper electrode, wherein a heterophase-occurence rate at a surface of the piezoelectric/electrostrictive layer is controlled to a range of 0.1 to 30%.

11 Claims, 14 Drawing Sheets

PIEZOELECTRIC/ELECTROSTRICTIVE FILM TYPE ELEMENTS AND PROCESS FOR PRODUCING THE SAME

BACKGROUND OF THE INVENTION (1) Field of the Invention

The present invention relates to piezoelectric/electrostrictive film type elements of a unimorph type or a bimorph to be used as various transducers, various actuators, etc. In particularly, the invention is aimed at advantageously improving durability of such piezoelectric/electrostrictive film type elements without deteriorating their piezoelectric/electrostrictive performance.

The piezoelectric/electrostrictive film type elements according to the present invention are intended to include elements for converting electric energies to mechanical energies, i.e., mechanical displacements, stress or vibration as well as elements for effecting reverse conversions thereof. Since the elements according to the present invention have dielectric property as well as the piezoelectric/electrostrictive performance, they can be also used as filmy condenser elements, etc.

(2) Related Art Statement

The piezoelectric/electrostrictive elements are used in wide fields including various transducers for converting electric energies to mechanical energies, i.e., mechanical displacements, forces or vibration, as well as elements for effecting reverse conversions thereof, various actuators, functional parts operating at a predetermined frequency range such as filters, various display devices such as displays, sound-emitting members such as loudspeakers, sensors such as microphones and ultrasonic wave sensors, etc.

For example, there is known a piezoelectric/electrostrictive element as shown in FIG. 1(a) which comprises a ceramic substrate 1 functioning as a vibrating plate, and a film-type piezoelectric/electrostrictive operating section 5, provided on the substrate 1, that is constituted by a first electrode film 2 as a lower electrode, a piezoelectric/electrostrictive layer 3 and a second electrode film 4 as an upper electrode (JP-A-3-128,681). In addition, there is also known a piezoelectric/electrostrictive element as shown in FIG. 1(b) in which a ceramic substrate 1 is provided with a cavity, and a bottom portion of the cavity is used as a vibrating section 1a, and a piezoelectric/electrostictive operating section 5 is integrally formed on the outer surface of the vibrating section 1a (JP-A-5-49,270).

A ceramic substrates constituting such piezoelectric/electrostictive elements, ceramic materials composed mainly of zirconium oxide partially stabilized with yttrium oxide are generally known (for example, JP-A-5-29,675, JP-A-5-97,437 and JP-A-5-270,912).

Use environments have recently variously changed with diversification in the piezoelectric/electrostrictive devices. Particularly, when the use environment in which the above-mentioned piezoelectric/electrostrictive film type elements are used is of a higher temperature and more humid atmosphere compared with conventional conditions, deterioration in material of the substrate poses a problem.

That is, if the piezoelectric/electrostictive film element is used in the above higher temperature and more humid environment, there is a tendency that the substrate begins to be degraded in the piezoelectric/electrostrictive film type element than the piezoelectric/electrostrictive operating section.

SUMMARY OF THE INVENTION

The present invention has been developed in view of the above actual circumstances, and is aimed at the provision of integrated piezoelectric/electrostrictive film type elements having excellent durability and an advantageous producing process thereof, without causing degradation in material of the substrate or lowering the piezoelectric/electrostrictive performance or deteriorating the characteristics of the piezoelectric/electrostrictive layer, even if used under the high-temperature and highly humid atmosphere.

In the following, the elucidation process of the present invention will be explained.

After having repeatedly performed strenuous investigations to accomplish the above object, the present inventors discovered that the substrate was deteriorated by lead element the substrate during the production. That is, although a ceramic material composed mainly of zirconium oxide has been formerly used as the substrate, it was clarified that the lead element entering such a ceramic substrate rapidly damaged the durability of the substrate when used in the high-temperature and highly humid condition.

Therefore, the present inventor then examined causes why the lead element entered into the substrate, and discovered that such a lead element entered the substrate when firing (thermally treating) the piezoelectric/electrostrictive material. That is, a lead-containing materials having excellent properties (such as lead zirconate titanate, etc.) was generally used as the piezoelectric/electrostrictive material, and a film of such a material was ordinarily formed as a piezoelectric/electrostrictive layer, and integrated by firing.

When a piezoelectric/electrostrictive layer made of such a lead-containing material is to be formed (by firing), the atmosphere is formerly controlled under condition with high lead concentration to prevent the evaporation of the lead element contained in the piezoelectric/electrostrictive material during firing, since such evaporation may cause changes in the composition of the piezoelectric/electrostrictive layer to thereby deteriorate the piezoelectric/electrostrictive performance.

As mentioned above, the piezoelectric/electrostrictive layer is formerly fired with a lead concentration-increased atmosphere in the presence of an evaporating source of a lead-containing material or the like so as to prevent the deterioration in the above characteristics. However, when the piezoelectric/electrostrictive layer is fired in the atmosphere with such a high lead concentrated, the lead element in the atmosphere penetrates into the ceramic substrate composed mainly of zirconium oxide, which causes deterioration in the quality of the substrate as mentioned before.

In order to solve the above problems, the present inventors repeatedly performed numerous experiments and examinations, and acquired the following knowledge.

(1) The firing atmosphere needs not always be an atmosphere having a high concentration of lead, even if the piezoelectric/electrostrictive layer contains the lead element. If some lead element evaporates from the piezoelectric/electrostrictive layer during firing, no deterioration occurs in the piezoelectric/electrostrictive layer.

(2) The rate of a heterophase occurring at a surface of the piezoelectric/electrostrictive layer during firing is preferable as an index for the judgment of the evaporated amount of the lead element from the piezoelectric/electrostrictive layer.

(3) The integrated piezoelectric/electrostrictive film type element in which the area rate of the heterophase occurring during firing is controlled to a range of 0.1 to 30% by adjusting the firing conditions suffers from neither degradation in quality in the substrate and deterioration in the characteristics of the piezoelectric/electrostrictive layer even when in use under high-temperature and highly humid atmosphere.

The present invention is based on the above recognition.

That is, the substantial features of the present invention are as follows.

(1) An integrated piezoelectric/electrostrictive film type element having excellent durability and comprising a substrate made of a ceramic material composed mainly of completely stabilized or partially stabilized zirconium oxide, and a piezoelectric/electrostrictive operating section integrated onto the ceramic substrate by a film-forming method, said piezoelectric/electrostrictive operating section comprising a lower electrode, a piezoelectric/electrostrictive layer of a lead element-containing composition, and an upper electrode, wherein a heterophase-occurrence rate at a surface of the piezoelectric/electrostrictive layer is controlled to a range of 0.1 to 30%.

(2) The integrated piezoelectric/electrostrictive film type element of above (1) having excellent durability in which the ceramic substrate is shaped in the form of a thin diaphragm portion, and said piezoelectric/electrostrictive operating section is integrally formed on an outer surface of the diaphragm portion.

(3) The integrated piezoelectric/electrostrictive film type element of above (1) or (2) having excellent durability in which the heterphase-occurence rate is controlled to a range of 1 to 10%.

(4) The integrated piezoelectric/electrostrictive film type element of above (1) or (2) having excellent durability in which the average grain size of crystals constituting the ceramic substrate is 0.1 to 2.0 $\mu$m.

(5) The integrated piezoelectric/electrostrictive film type element of above (1) or (2) having excellent durability in which a thickness of the piezoelectric/electrostrictive layer is not more than 100 $\mu$m.

(6) The integrated piezoelectric/electrostrictive film type element of above (1) or (2) having excellent durability in which a thickness of the piezoelectric/electrostrictive operating section is not more than 150 $\mu$m.

(7) The integrated piezoelectric/electrostrictive film type element of above (2) in which a thickness of the diaphragm portion is not more than 50 $\mu$m.

(8) A process for producing an integrated piezoelectric/electrostrictive film type element having excellent durability, comprising the steps of preparing a substrate made of a ceramic material composed mainly of completely stabilized or partially stabilized zirconium oxide, and successively forming a lower electrode, a piezoelectric/electrostrictive layer of a lead element-containing composition, and an upper electrode on the ceramic substrate by a film-forming method, said lower electrode, said piezoelectric/electrostrictive layer and the upper electrode constituting a piezoelectric/electrostrictive operating section and at least said piezoelectric/electrostrictive layer being fired, wherein a produced rate of heterophase occurring at a surface of the piezoelectric/electrostrictive layer is controlled to a range of 0.1 to 30% in terms of an area rate by adjusting a concentration of lead in a firing atmosphere and/or an amount and a speed of a running fluid of the firing atmosphere.

(9) The highly durable, integrated piezoelectric/electrostrictive film type element-producing process of above (8) in which the atmosphere is controlled by adjusting at least one condition selected from the following four conditions i) a composition ratio, a configuration, a weight and an arranged location of an evaporating source containing lead as a constituent element; ii) an arranged location of a piezoelectric/electrostrictive material in a firing furnace or a firing vessel; iii) an opening degree of the firing furnace or the firing vessel; and iv) feeding an absorbent for absorbing a lead element in the firing atmosphere.

These and other objects, features and advantages of the invention will be appreciated upon reading the following description of the invention when taken in conjunction with the attached drawings, with the understanding that some modifications, variations and changes could be made by the skilled person in the art to which the invention pertains.

BRIEF DESCRIPTION OF THE DRAWINGS

For a better understanding of the invention, reference is made to the attached drawings, wherein.

DETAILED DESCRIPTION OF THE INVENTION

In the following, the present invention will be explained in more detail with reference to the attached drawings.

Figure 1A:
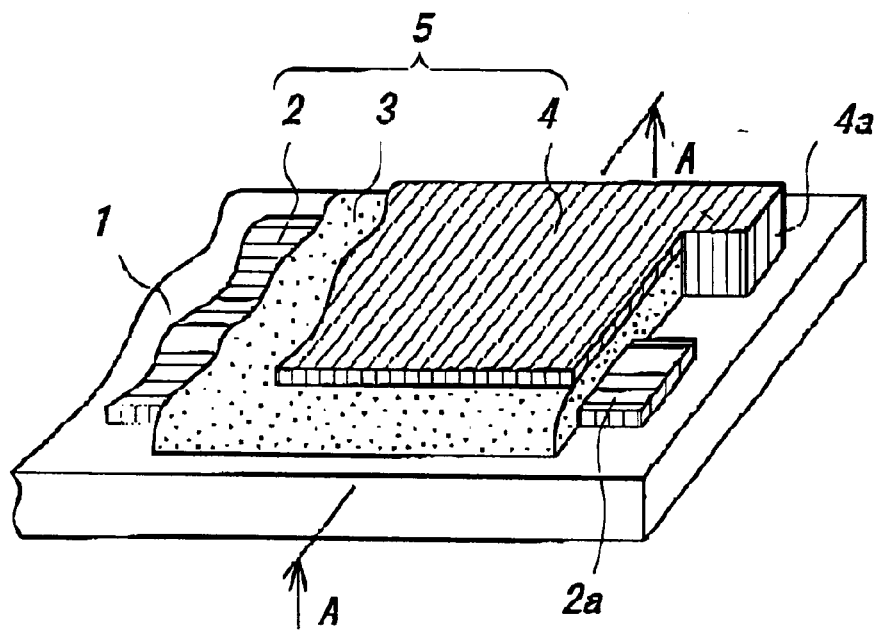
FIG. 1(a) is a partially cut-away, perspective view of a planar piezoelectric/electrostrictive film type element.
Figure 1B:
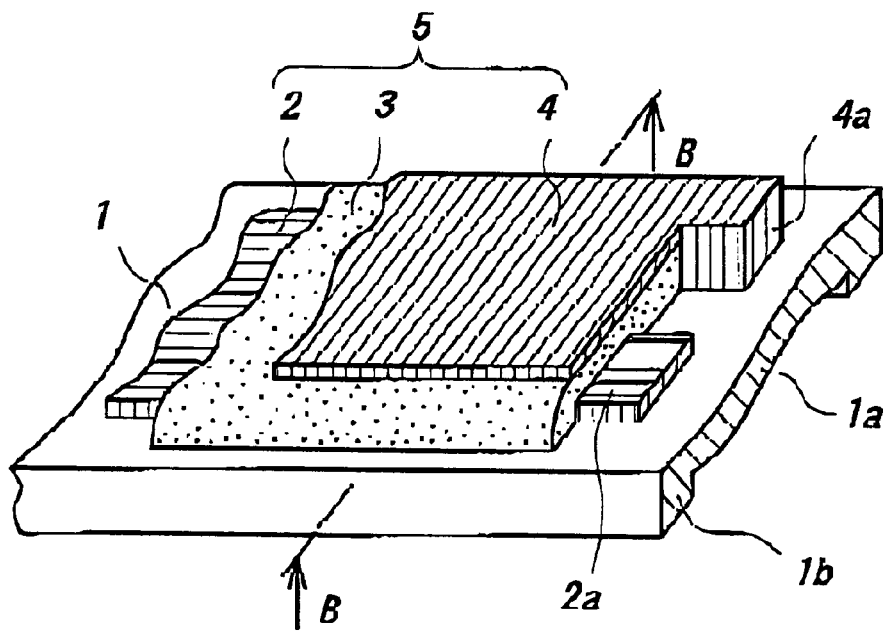
FIG. 1(b) is a partially cutaway, perspective view of a piezoelectric/electrostrictive film type element having a cavity structure, the present invention being applicable to both of the elements.
Figure 2A:
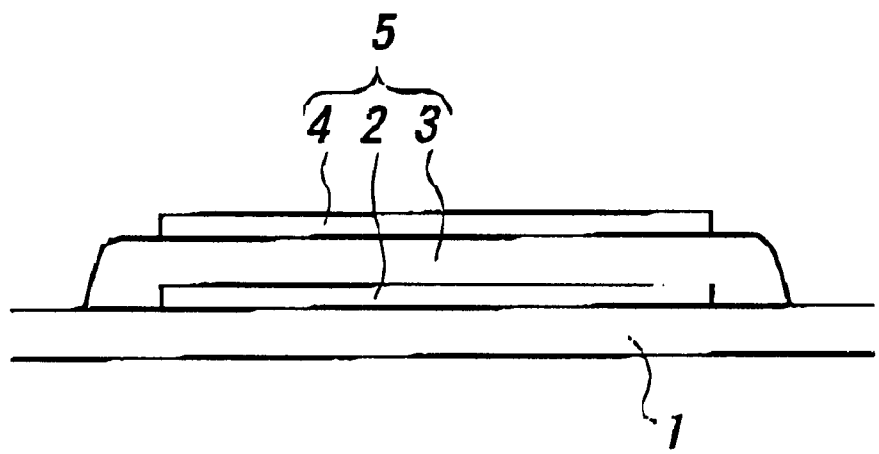
FIGS. 2(a) and 2(b) are sectional views of the piezoelectric/electrostrictive film type elements in FIGS. 1(a) and 1(b) along A—A and B—B, respectively.
Figure 2B:
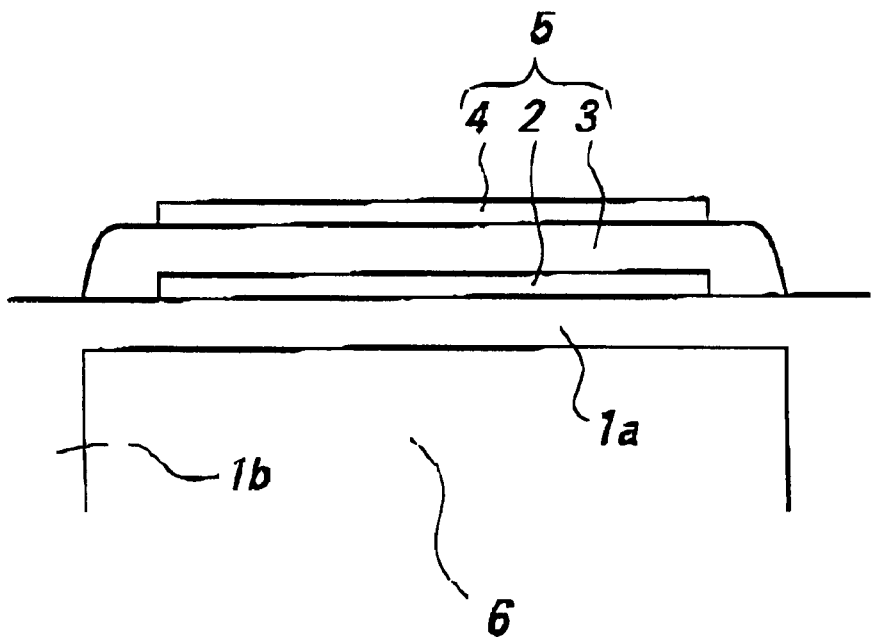

FIGS. 1(a) and 1(b) are perspective views of piezoelectric/electrostrictive film type elements (actuators) according to the present invention, and FIGS. 2(a) and 2(b) sectional views thereof along A—A and B—B, respectively.

In these figures, the piezoelectric/electrostrictive film type element in FIGS. 1(a) and 2(a) is of a general structure in which a piezoelectric/electrostrictive operating section composed of a lower electrode, a piezoelectric/electrostrictive layer and an upper electrode is formed on a planar ceramic substrate. On the other hand, the piezoelectric/electrostrictive element in FIGS. 1(b) and 2(b) is of a so-called cavity structure in which outer edge portions of a substrate are thick. This structure element has an advantage that an inner portion (diaphragm portion: substantially vibrating section) sandwiched between the thick outer edge portions can be made particular thin.

In FIGS. 1 and 2, reference numeral 1 denotes a ceramic substrate, 2 a first electrode film (lower electrode), 3 a filmy piezoelectric/electrostrictive layer, and 4 a second electrode film (upper electrode). They are successively laminated upon the ceramic substrate 1 (through firing) by a film-forming method, thereby constituting a piezoelectric/electrostrictive operating section 5 as an integrated multi-layered structure. In case of the cavity structure, 1a and 1b denote the vibrating section and the thick outer edge portion, respectively, and 6 a cavity.

The first and second electrode films 2 and 4 extend outwardly from an edge portion of the piezoelectric/electrostrictive layer 3 to form lead portions 2a and 4a, respectively. Voltage is applied to the electrode films 2 and 4 through the lead portions 2a and 4a, respectively.

Further, the ceramic substrate 1 finally takes a sintered state. The ceramic substrate may be formed by preliminary sintering prior to the formation (firing) of the piezoelectric/electrostrictive operating portion 5 of the piezoelectric/electrostrictive film type element according to the above embodiments. Alternatively, the substrate may be formed by preparing a green sheet of a substrate-forming material, forming a piezoelectric/electrostrictive section 5 on the green sheet by a film-forming method mentioned later and simultaneously sintering them. The substrate may be also formed by forming a first electrode film 2 and a piezoelectric/electrostrictive layer 3 on such a green sheet and then sintering them.

Among the above, the method by which the ceramic substrate 1 is formed by preliminarily sintering is advantageously employed in that warping of the element can be reduced and that a necessary precision in the pattern dimension can be realized. Further, according to this method, the temperature in firing of the integral lamination of the piezoelectric/electrostrictive layer 3 onto the ceramic substrate can be set at less than a sintering temperature of the ceramic substrate 1.

As shown in FIG. 1(b), in case of the ceramic substrate having a cavity structure, a green sheet for a vibrating plate and a green sheet provided with a hollow space corresponding to such a cavity by using a mold or machining such as ultrasonic machining are laminated one upon another as first and second layers, subjected to a thermal compression bonding to each other and fired.

FIG. 1(b) takes the two-layered structure, but the rigidity of the substrate may be enhanced by providing third and fourth layers to close an opening at a side opposite to the vibrating section of the cavity. Alternatively, the ceramic substrate 1 may be formed by simultaneously laminating a layer to be used as a rear wiring board.

In this case, it may be that a thick film of a pattern provided with a hollow space corresponding to a cavity may be printed as a second layer on a green sheet as a third layer by a thick film-forming method, such as a screen printing method, and a substrate having a three-layered structure is formed by laminating a green sheet for a first layer corresponding to a vibrating plate with the second layer, thermal compression bonding and firing them.

The piezoelectric/electrostrictive operative section 5 is formed on the ceramic substrate 1 by the thick film-forming method such as by screen printing, spraying, dipping or coating or by a thin film-forming method such as ion beam, sputtering, vacuum deposition, ion plating, CVD or plating.

First, after a first electrode film (lower electrode) 2 is formed on a surface of a ceramic substrate 1 by the above film-forming method, a piezoelectric/electrostrictive layer 3 is similarly formed thereover.

The thick-firm forming methods such as screen printing, dipping coating and electrophoresis are advantageously suitable for the formation of the piezoelectric/electrostrictive layer 3.

The above methods are simple methods in the formation of piezoelectric films with use of a paste, a slurry, a suspension, an emulsion, a sol or the like composed mainly of piezoelectric ceramic particles having the average grain size of 0.01 to 5.0 $\mu$m, preferably 0.05 to 3.0 $\mu$m, and such methods afford good piezoelectric operating characteristics. Further, the electrophoresis can not only form the film at a high density with a high configuration precision, but also has features as described in a technical literature. Kazuo Anzai "DENKI KAGAKU 53", No. 1 (1985) pp 63–68.

Therefore, the above-mentioned methods may be selectively appropriately used under consideration of the required precision and reliability.

Further, a desired shape of the above piezoelectric/electrostrictive layer 3 is realized by forming a pattern through screen printing, photolithography or the like or by forming a pattern through removal of an unnecessary portion via laser working with eximer or YAG, or machining such as slicing or ultrasonic machining.

The structure of the element produced there and the configuration of the filmy piezoelectric/electrostrictive operating section are never restrictive. Depending upon uses, any shape or configuration may be employed. For example, polygonal shapes such as triangle and rectangular shapes, round, shapes such as circular, elliptical and toroidal shapes, comb-like shape, lattice-like shape or peculiar shapes formed by combining them in any manner may suffice.

The thus formed piezoelectric/electrostrictive layer 3 is fired (heat treatment) so that it may be integrated with the ceramic substrate 1 via the lower electrode 2. In the present invention, this firing step is particularly important.

That is, it is one of the objects of the present invention to propose the piezoelectric/electrostrictive film type element which controls both the evaporation of the lead element from the piezoelectric/electrostrictive layer and the invasion of the lead element into the substrate by adjusting the concentration of the lead in the atmosphere during firing the piezoelectric/electrostrictive layer in the presence of the vapor containing at least lead element generated from the piezoelectric/electrostrictive material containing the lead element as its constituent element or in the process of an evaporating source of a lead-containing material for controlling the composition of the piezoelectric/electrostrictive layer. The rate of a heterophase occurring at the surface of the piezoelectric/electrostrictive layer after the firing is used as an index for the judgment of the evaporated amount of the lead element from the piezoelectric/electrostrictive layer.

Figure 3:
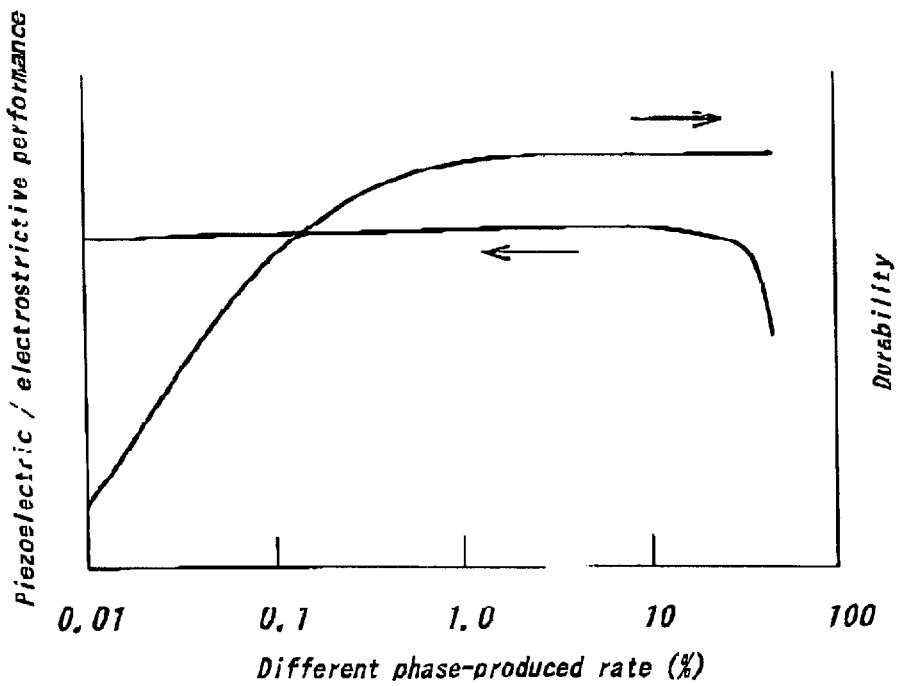
FIG. 3 is a graph showing the relationships between the heterophase-occurrence rate and the piezoelectric/electrostrictive performance or the durability.

FIG. 3 shows results obtained by investigating the relationships between the heterophase-occurence rate at the surface and the piezoelectric/electrostrictive performance or the durability with respect to the piezoelectric/electrostrictive layers fired in various conditions.

The piezoelectric/electrostrictive performance was evaluated by a displacement performance, and the durability was evaluated by a frequency of cracking in the vibrating sections of the substrates.

As shown in FIG. 3, when excellent piezoelectric/electrostrictive performance and excellent durability were both obtained, the heterophase-occurrence was in a range of 0.1 and 30% in terms of an area rate. When this rate was 1 to 10%, particularly excellent results were obtained.

In order to produce the heterophase in an appropriate range on the surface of the piezoelectric/electrostrictive layer after the film formation as mentioned above, the concentration of lead in the firing atmosphere and/or the amount and the speed of the running fluid of the firing atmosphere needs to be accurately adjusted.

Concrete controlling measures are as follows:

When a firing vessel is used, the concentration of lead in the firing atmosphere and/or the amount and the speed of the running fluid of the firing atmosphere can be adjusted by controlling the packed amount of fired body (piezoelectric/electrostrictive material) and the open degree of the firing vessel.

When the atmosphere is controlled with the evaporating source, the concentration of lead in the lead-containing firing atmosphere and/or the amount and the speed of the running fluid of the firing atmosphere in the vicinity of the fired body can be adjusted by adjusting the compositional ratio of the evaporating source containing lead as its constituting element, the configuration (molded bodies of powder or pellets employed, for example), weight, the arranged position between the fired bodies and evaporating source, etc. In this case, the firing atmosphere is more preferably adjusted by using the above firing vessel and placing the evaporating source thereto.

Any evaporating source may be employed so long as it generates a vapor containing at least lead element. Piezoelectric/electrostrictive materials and their combinations mentioned later are preferred. The piezoelectric/electrostrictive material having the same composition as that of the piezoelectric/electrostrictive layer used is more preferably used.

When the piezoelectric/electrostrictive material having the same composition as that of the piezoelectric/electrostrictive layer is used as the evaporating source, a dummy pattern of which arrangement and configuration are adjusted may be formed on the ceramic substrate as an evaporating source, followed by firing. Alternatively, this dummy pattern may be formed simultaneously with the formation of the piezoelectric/electrostrictive layer, followed by firing.

In this case, the dummy pattern will be an effective measure for adjusting the concentration distribution of the firing atmosphere near the piezoelectric/electrostrictive layer formed on the same ceramic substrate.

Control based on the arrangement of the substrate on firing the piezoelectric/electrostrictive layer is performed as follows.

When plural sets of ceramic substrates formed with piezoelectric/electrostrictive layers thereon are simultaneously integrally fired, the arrangement of the ceramic substrates is preferably adjusted under consideration of the vapors containing the lead element generated from the individual piezoelectric/electrostrictive layers.

When the ceramic substrates are fired in a staked state with use of setters (substrate-placing plates), the atmosphere near the piezoelectric/electrostrictive layer is preferably adjusted under consideration of the distance from the surface of the piezoelectric/electrostrictive layer to the setter.

The above is applicable to cases where a firing vessel is used. In such cases, it is also preferable to adjust the firing atmosphere near the piezoelectric/electrostrictive layer under consideration of the distance between the inner wall of the firing vessel.

Control with absorbing body is performed as follows. In order to make thinner the concentration of the vapor containing the lead element in the firing atmosphere, the vapor concentration may be adjusted by arranging, around fired bodies, an absorbing body for absorbing the lead element-containing vapor.

As to materials for absorbing the lead element-absorbing vapor, those capable of withstanding the firing temperature and readily to react with the lead element, for example, titanium, magnesia and mullite are preferably used.

The firing (thermally treating) temperature at which the piezoelectric/electrostrictive layer is integrally formed on the ceramic substrate depends upon the material constituting them, and appropriately determined under consideration of controlling of the atmosphere. The temperature is ordinarily 900 to 1400° C., preferably 1000 to 1400° C.

It is considered that the heterophase occurring in the above firing treatment is formed through evaporation of a material having a relatively high vapor pressure, such as a lead-containing material, in the composition constituting the piezoelectric/electrostrictive material.

The rate of the heterophase can be easily detected through observation of the piezoelectric/electrostrictive layer with an electron microscope or the like after the firing and monitoring of the distribution of the components.

Since an emitted rate of reflected electrons forming a reflected electron image uniformly increase with increase in the atomic number, the reflective electron images obtained with the scanning electron microscope can generally be understood as difference in composition through judging the magnitude of the atomic number based on the contrast of the image (A heavier element material can be observed more brightly than a lighter element material). Observation of the surface properties with secondary electron images can be an effective measure for judging differences in composition in more detail.

Therefore, since the reflective electron images of the heterophase portion occurring at the surface of the piezoelectric/electrostrictive layer by firing represents a composition lacking the lead element as a heavy element, the image is relatively dark. Accordingly, this image can be easily judged as the heterophase portion.

Thereafter, a second electrode film 4 is formed on the piezoelectric/electrostrictive layer 3 formed above and then fired as the same way as in the case of the first electrode film, thereby completing the piezoelectric/electrostrictive operating section 5.

In the above, description is made of a case where the first electrode is formed and fired, the piezoelectric/electrostrictive layer is formed and fired, and finally the second electrode is formed and fired for the integration thereof. The formation (firing) of the piezoelectric/electrostrictive operating section is not this method. For example, the first electrode, the piezoelectric/electrostrictive layer and the second electrode may be successively formed and fired altogether. Alternatively, it may be that the first electrode and the piezoelectric/electrostrictive layer are successively formed and simultaneously fired, and then the second electrode is formed and fired. Alternatively, the first electrode is formed and fired, the piezoelectric/electrostrictive layer and the second electrode layer are successively formed and simultaneously fired.

Among them, the successive formation and firing of the respective layers is more preferable, because the layers can be successively fired at their respective lower temperatures.

Next, preferred materials in each layer constituting the piezoelectric/electrostrictive operating section will be explained.

The material for the first electrode film is not particularly limited, so long as it can withstand an oxidizing atmosphere at around the above-mentioned firing temperature. For example, metals alone or alloys, mixtures of such metals and alloys with insulating ceramics, and further conductive ceramics may be used. Among them, noble metals having high melting points, such as platinum, palladium and rhodium, and electrode materials composed mainly of alloys of silver-palladium, silver-platinum, or platinum-palladium are preferred. In particular, materials composed mainly of platinum are highly suitable.

It is preferred that the above-mentioned metals or alloys are added with metal oxides, such as alumina, titanium, zirconia, ceria, copper oxide, etc. It is also preferred that the material for the first electrode film is comprised of a cermet material wherein the same ceramic materials as those for the ceramic substrate or piezoelectric/electrostrictive material, to be described hereinafter, are dispersed in the metal or alloy. When a cermet material is used as the electrode, it is possible to achieve a significant functional advantage that deterioration with time of the displacing operation of the piezoelectric/electrostrictive element can be effectively suppressed.

When glass such as silicon oxide is used as an additive to the first electrode, it is likely to react with piezoelectric/electrostrictive layer during the heat treatment, which causes deterioration of the characteristics of the element. Therefore, use of such glass is preferably avoided. It is preferred that the addition amount of the additive to the electrode is around 5 to 30 vol % in the case of the substrate material, and around 5 to 20 vol % <in the case of the piezoelectric/electrostrictive material.

The second electrode film is not particularly limited to any material. In addition to the materials to be used for the first electrode, sputtering films such as of gold, chromium and copper, or resinate (organometallic compound) print films comprised of gold or silver may be used.

As the piezoelectric/electrostrictive material for the piezoelectric/electrostrictive layer, any material may be used so long as it contains lead as its constituting element and exhibits electric field-induced strain such as piezoelectric or electrostrictive effects. For example, the material may be crystalline or amorphous, or a dielectric ceramic material, ferrodielectric ceramic material or anti-ferrodielectric ceramic material may be used. Further, the material may need a polarization treatment or not polarization treatment.

The piezoelectric/electrostrictive material constituting the piezoelectric/electrostrictive layer may be adjusted to have a desired composition and further a desired rate of the heterophase at the surface of the piezoelectric/electrostrictive layer by preliminarily appropriately adjusting the compositional proportion of the lead element and also adjusting the composition with the firing atmosphere for integrally firing the piezoelectric/electrostrictive layer.

As preferred piezoelectric/electrostrictive materials, materials composed mainly of lead zirconate titanate (PST-based materials), materials composed mainly of lead titanate, materials composed mainly of lead zirconate, materials composed mainly of lead magnesium niobate (PMN-based materials), materials composed mainly of lead nickel niobate (PNN-based materials), materials composed mainly of lead magnesium tungstenate, materials composed mainly of lead manganese niobate, material composed mainly of lead antimony stannate, materials composed mainly of lead zinc niobate, materials composed mainly of lead magnesium tantalate, material composed mainly of lead nickel tantalate, and composite materials thereof may be recited.

To the above-mentioned materials may be incorporated as additive(s) oxides and other compounds of lanthanum, barium, niobium, zinc, cerium, cadmium, chromium, cobalt, antimony, iron, yttrium, tantalum, tungsten, nickel, manganese, lithium, strontium, magnesium, calcium, hithmus, stanum, etc. For example, PLZT-based materials in which an oxide or the like of lanthanum is added to a material composed mainly of a PZT-based material may be used.

Addition of glass such as silicon oxide is preferably avoided, because it readily reacts with the piezoelectric/electrostrictive material and makes the maintenance of the desired material composition difficult.

Among the above piezoelectric/electrostrictive materials, materials composed mainly of lead magnesium niobates, lead zirconate and lead titanate, materials composed mainly of lead nickel niobate, lead magnesium niobate, lead zirconate and lead titanate, materials composed mainly of lead nickel tantalate, lead magnesium niobate, lead zirconate and lead titanate, or materials composed mainly of lead magensium tantalite, lead magensium niobate, lead zirconate and lead titanic are preferably used.

Among them, the materials composed mainly of lead magnesium niobates, lead zirconate and lead titanate are preferably used. For, such a material not only has a high piezoelectric constant, but also it undergoes particularly less reaction with the substrate material during the heat treatment.

In the case of the multi-component based piezoelectric/electrostrictive material, the piezoelectric/electrostrictive characteristic changes depending upon the composition of the components. However, the three-component based material of lead magnesium niobate-lead zirconate-lead titanate favorably used in the piezoelectric/electrostrictive element according to the present invention preferably has a composition near the morphotropic phase boundary of the pseudo-cubic crystal-tetragonal crystal-rhombohedral crystal. Particularly, a composition composed of 15 to 50 mol % of lead magnesium niobate, 10 to 45 mol % of lead zirconate and 30 to 40 mol % of lead titanate is advantageously used, because it has a high piezoelectric constant and an electro-mechanical coupling factor.

As the material for constituting the ceramic substrate, ceramic materials composed mainly of zirconium oxide are advantageously suitable in acquiring properties that mechanical strength is high, the above-mentioned heat treatment is possible around 1400° C., the piezoelectric/electrostrictive operating section can be integrally laminated without using an adhesive or the like, and operational characteristics of large displacement and generated forces and high response speed are excellent. Particularly, the materials composed mainly of zirconium oxide completely or partially stabilized with at least one of yurium oxide, ytterbium oxide, cerium oxide, calcium oxide and magnesium oxide is preferred. Namely, such a material makes it possible to obtain a high mechanical strength and a high toughness even when the substrate has a small thickness. Further, such a material undergoes a small stress upon a heat treatment together with a piezoelectric/electrostrictive material adopted in the film-forming method. Moreover, such a material exhibits less chemical reactivity with the piezoelectric/electrostrictive material.

The addition amount of the above mentioned compound for stabilizing zirconium oxide is preferably 1 to 30 mol % for yttrium oxide or ytterbium oxide, 6 to 40 mol % of cerium oxide and around 5 to 40 mol % of calcium oxide or magnesium oxide. Among them, yttrium oxide is particularly preferably used as the stabilizer. In the case, it is preferably not less than 2 mol % from the standpoint of assuring excellent durability even in a case where lead enters the substrate on firing the piezoelectric/electrostrictive layer and not more than 8 mol % form the standpoint of obtaining structurally excellent strength, the crystalline phase of zirconium oxide added with yttrium oxide is partially stabilized in such an addition range, which enables the production of the substrate having excellent substrate characteristics.

Further, the concentration of the lead-containing atmosphere for integrally firing the piezoelectric/electrostrictive layer is appropriately adjusted, more concretely when the occurrence rate of the heterophase at the surface of the piezoelectric/electrostrictive layer satisfies a range of 0.1 to 30% in terms of the area percentage, the durability of the piezoelectric/electrostrictive element can be further enhanced by increasing the addition amount of yttrium oxide in a range of 2 to 8 mol %.

On the other hand, if the occurrence rate of the heterophase at the surface of the piezoelectric/electrostrictive layer is less than 0.1% in terms of the area percentage, sufficient durability cannot be obtained even by adjusting the addition amount of yttrium oxide in the range of 2 to 8 mol %.

Furthermore, sintering aid(s) such as aluminum oxide or titanium oxide or further clay may be added to such stabilized zirconium. In this case, it is preferable to adjust the composition and the addition amount of the sintering aid so that 1% or more of silicon oxide ($SiO_2$, SiO) may not be included in the fired substrate. Because if excessive silicon oxide is included in the substrate, the substrate is likely to undergo a reaction with the piezoelectric material during heat treatment, which makes controlling of the composition difficult.

Next, preferable thicknesses of each of the ceramic substrate and each of the layers constituting the piezoelectric/electrostrictive operating section will be explained.

Ceramic substrate

At least a part of that portion of the ceramic substrate in this embodiment which the piezoelectric/electrostrictive operating section is formed preferably designed as a thin portion. The thickness of the substrate is generally not more than 50 μm, preferably not more than 30 μm, more preferably not more than 15 μm so as to obtain high response and large displacements of the filmy element.

Further, particularly in the thin portion, the average grain size of crystals is generally preferably 0.1 to 2.0 μm, and more preferably not less than 0.1 μm and not more than 1.0 μm so as to improve the operating characteristics of the piezoelectric/electrostrictive operating section formed on such thin portion, thereby giving large displacements and large forces as an actuator or a detecting portion, for example.

In addition, in a unitary planar ceramic substrate as shown in FIG. 1(a), in order to achieve a high speed response characteristic and a large displacement of the film-type element, the thickness of the ceramic substrate is generally not more than 50 mm, preferably not more than 30 μm, and more preferably not more than 15 μm.

Furthermore, in at least that portion of the ceramic substrate in which the piezoelectric/electrostrictive operating section is formed, the average gain size of crystals is generally preferably 0.1 to 2.0 μm, more preferably not more than 1.0 μm so as to enhance the operating characteristic of the piezoelectric/electrostrictive operating section and to give large displacements and large forces as an actuator or a detecting portion, for example.

Electrode film

The thickness of the electrode film formed using the above conductive material is generally not more than 20 μm, preferably not more than 5 μm. Particularly the upper electrode formed has a thickness preferably not more than 1 μm, more preferably 0.5 μm.

Piezoelectric/electrostrictive layer

The thickness of the piezoelectric/electrostrictive layer formed using the above piezoelectric/electrostrictive layer is generally not more than 100 μm, preferably not more than around 50 μm and more preferably not more than around 3 μm to 40 μm so as to give large displacements at a relatively low operating voltage.

The thickness of the entire piezoelectric/electrostrictive operating section constituted by the above piezoelectric/electrostrictive layer, the lower electrode and the upper electrode is generally not more than 150 μm, preferably 50 μm.

In the above, explanation has been made with respect to the piezoelectric/electrostrictive film type element as shown in FIGS. 1(a) and 1(b), as a typical example, though the present invention is not limited to this embodiment. The invention is also applicable to piezoelectric/electrostrictive film type elements having the structures explained below.

Figure 4:
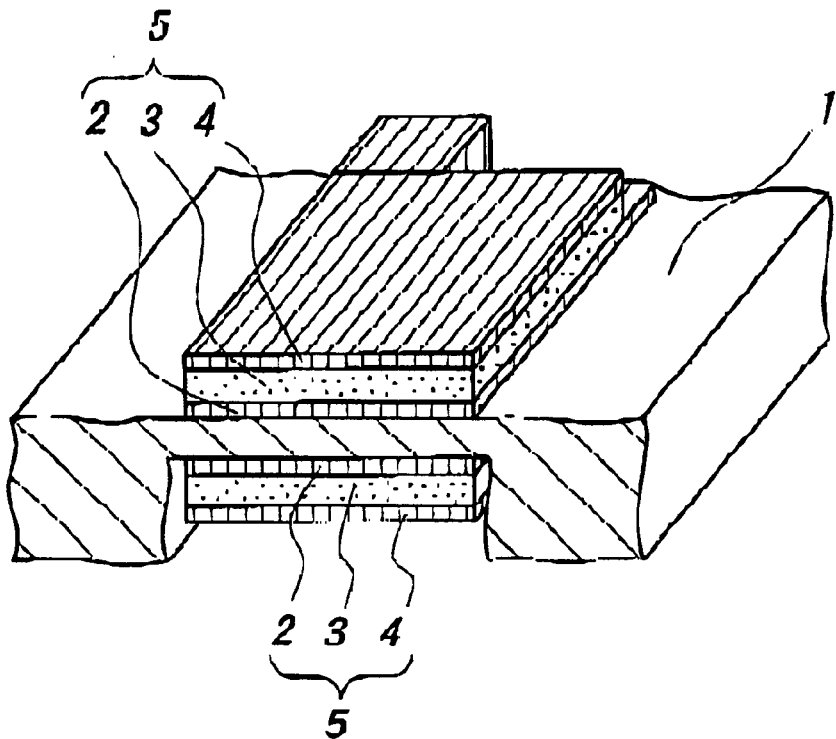
FIG. 4 is a perspective view of a further embodiment of the piezoelectric/electrostrictive film type element according to the present invention.

That is, an element shown in FIG. 4 is a bimorph type of a piezoelectric/electrostrictive film type element in which piezoelectric/electrostrictive operating sections 5 are provided at each of front and rear surface of a thin portion of ceramic substrate 1.

Figure 7:
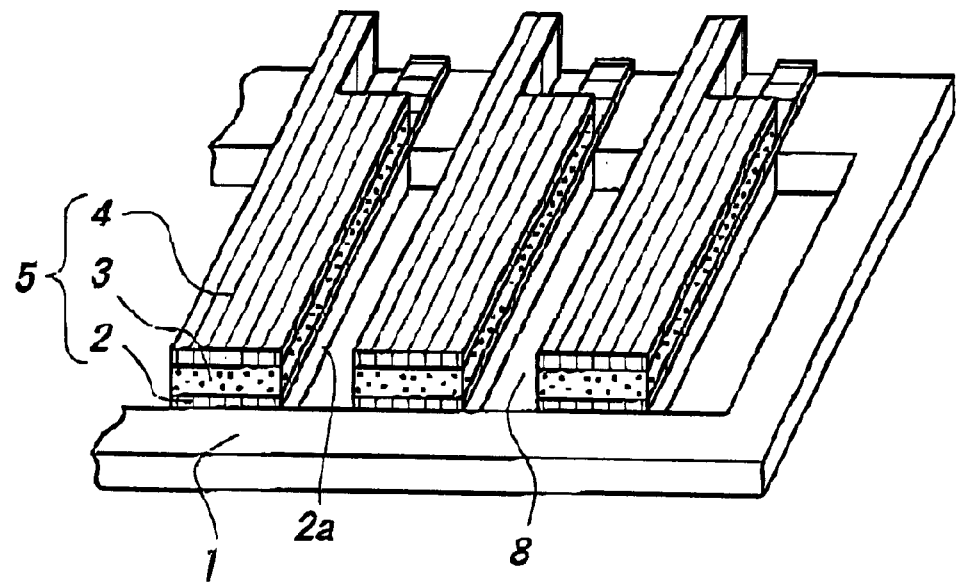
FIG. 7 is a perspective view of a still further embodiment of the piezoelectric/electrostrictive film type element according to the present invention.

In each embodiments in FIGS. 5 to 8, a plurality of piezoelectric/electrostrictive operating sections 5 are provided on a ceramic substrate in parallel. Particularly in the elements shown in FIGS. 5 and 6, slits 7 are formed at the ceramic substrate 1 located between these plural piezoelectric/electrostrictive operating sections 5, so that the piezoelectric/electrostrictive operating sections 5 are independent. In the element of FIG. 7, slender rectangular holes 8 each having a slender shape are provided in the ceramic substrate 1 at a predetermined pitch to give a ladder-like shape of the ceramic substrate 1. A piezoelectric/electrostrictive operating section 5 is formed at each of connecting portions 2a of the ladder-shaped ceramic substrate 1 sandwiched between the adjacent rectangular holes 8,8.

Figure 5:
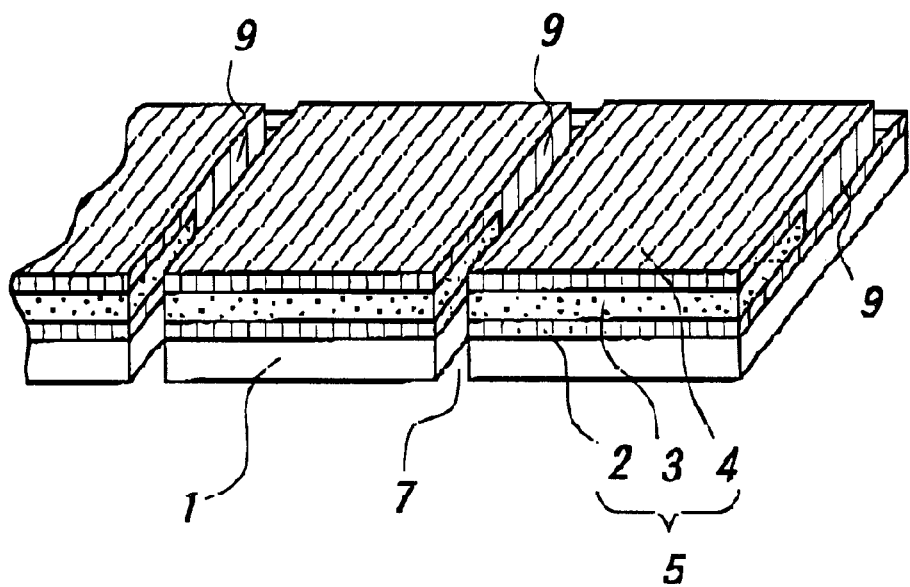
FIG. 5 is a perspective view of a still further embodiment of the piezoelectric/electrostrictive film type element according to the present invention.
Figure 6:
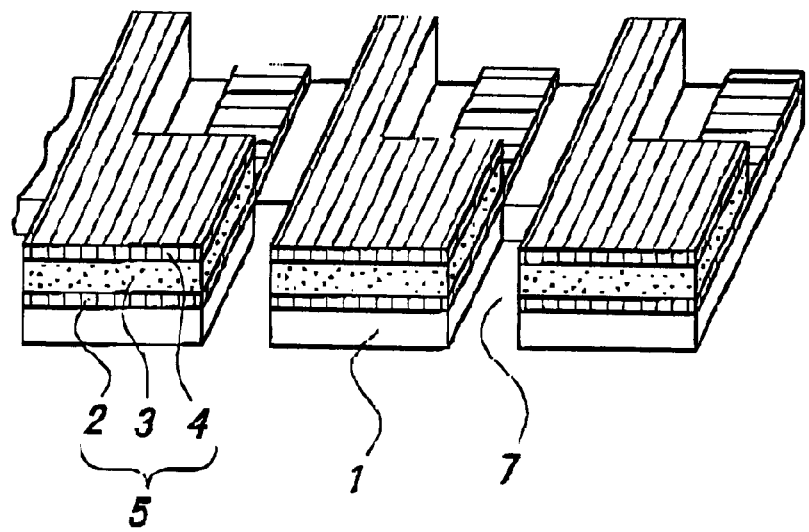
FIG. 6 is a perspective view of a still further embodiment of the piezoelectric/electrostrictive film type element according to the present invention.

In FIG. 5, 9 denotes a back portion of the piezoelectric/electrostrictive layer 3, which is an insulating film for electrically insulating the first electrode film 2 form the second electrode film 4.

Figure 8:
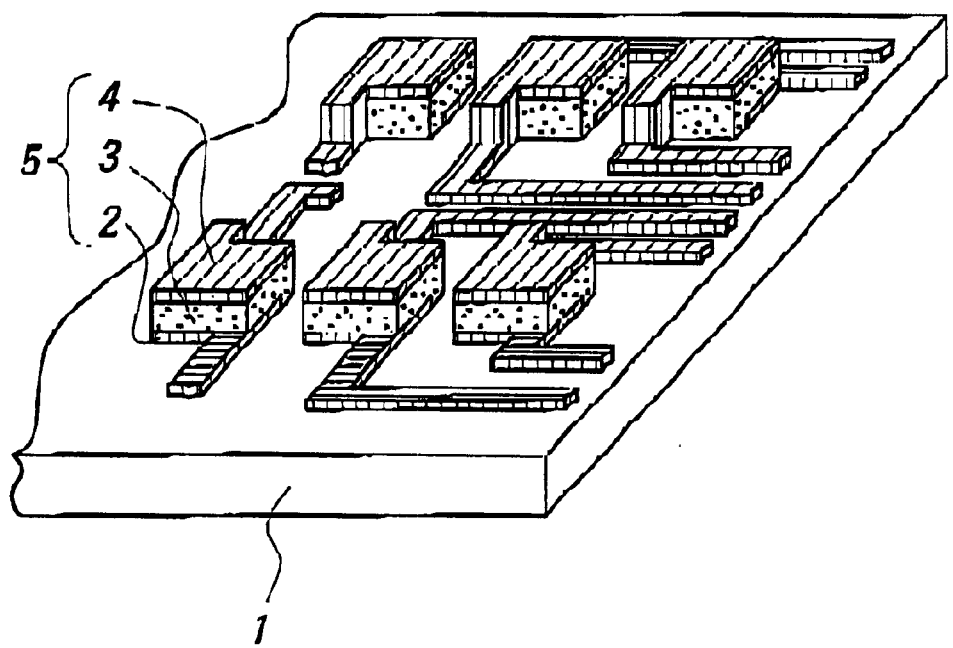
FIG. 8 is a perspective view of a still further embodiment of the piezoelectric/electrostrictive film type element according to the present invention.

In the element of FIG. 8, a plurality of piezoelectric/electrostrictive operating sections 5 are integrally provided on a unitary large ceramic substrate 1 at a predetermined pitch.

Figure 9A:
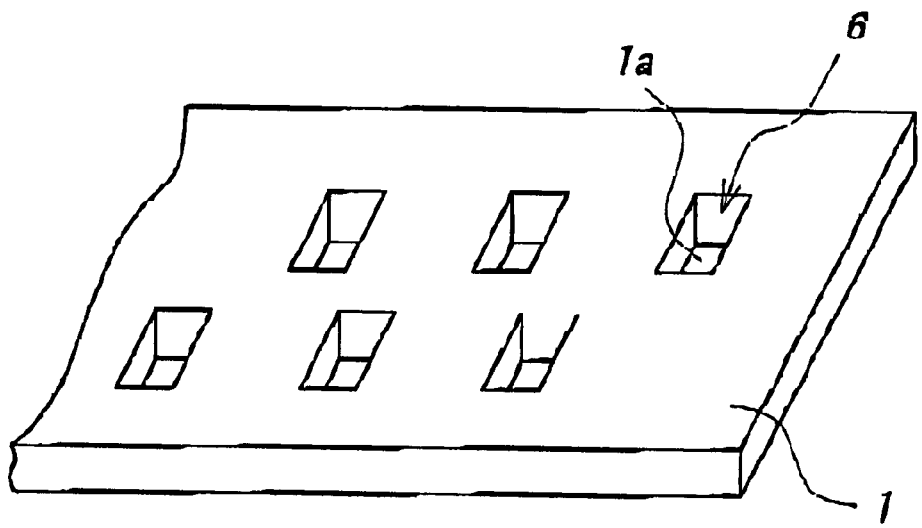
FIGS. 9(a) and 9(b) are perspective views from rear and front surface sides of a modified embodiment of the piezoelectric/electrostrictive film type element shown in FIG. 8, respectively.
Figure 9B:
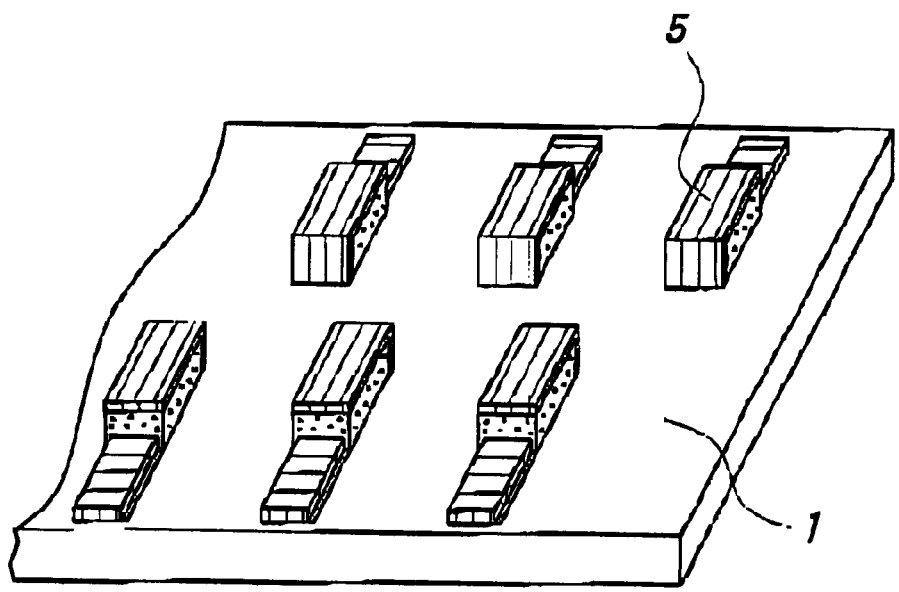

FIGS. 9(a) and 9(b) show an embodiment in which the configuration of the ceramic substrate and the arrangement of the piezoelectric/electrostrictive operating sections 5 are modified from those in the element shown in FIG. 8.

That is, as clear from the configuration of a rear face of the substrate shown in FIG. 9(a), cavities 6 each having a predetermined size are provided in the rear face of the thick ceramic substrate 1 at a predetermined pitch in a zigzag fashion, so that the substrate has a structure in which vibrating sections 1a provided by bottoms of the cavities 6 are arranged zigzag. A shown in FIG. 9(b), the piezoelectric/electrostrictive operating sections 5 are integrally formed and arranged zigzag on the substrate, while located on the vibrating sections 1a, respectively.

In each of the thus constructed elements, the voltage is applied across two electrodes constituting the piezoelectric/electrostrictive operating section in the same manner as conventionally so that the element may function as an actuator. Thereby, the electric field acts upon the piezoelectric/electrostrictive layer, which causes an electric field-induced strain in the piezoelectric/electrostrictive layer based on the this electric field. Consequently, a bending displacement or a force is generated in a direction vertical to the planar surface of the ceramic substrate.

In the present invention, no particular limitation is posed on the connecting way for each electrode. Any of formerly known connecting ways shown in FIGS. 10 to 12 may be employed.

Figure 10A:
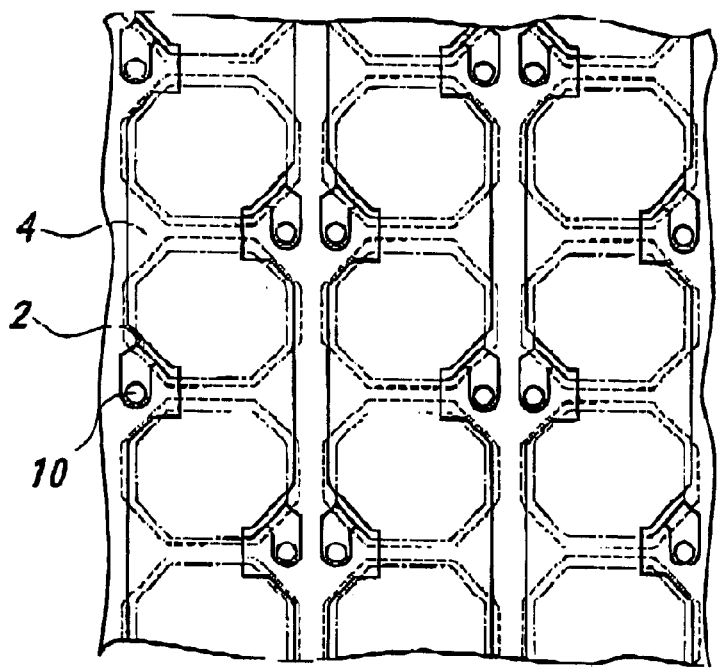
FIGS. 10(a) and 10(b) are views showing a connecting configuration to an electrode film according to the present invention.
Figure 10B:
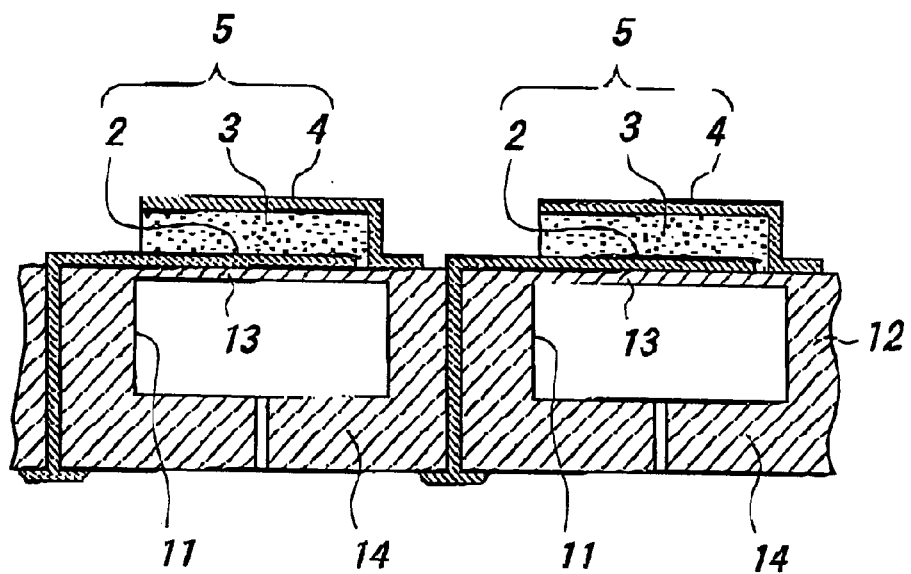
Figure 11:
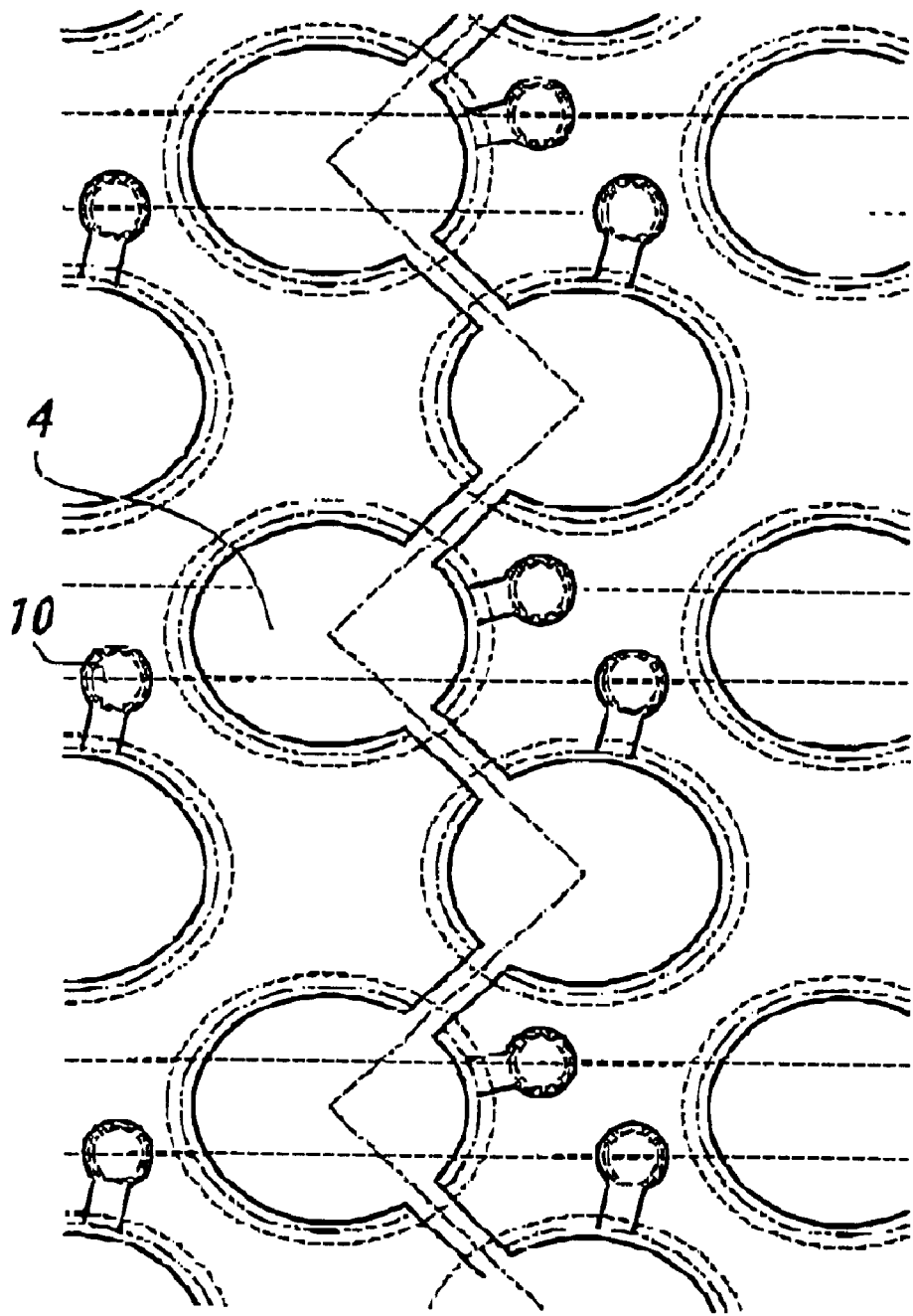
FIG. 11 is a view showing another connecting configuration to an electrode film according to the present invention.
Figure 12:
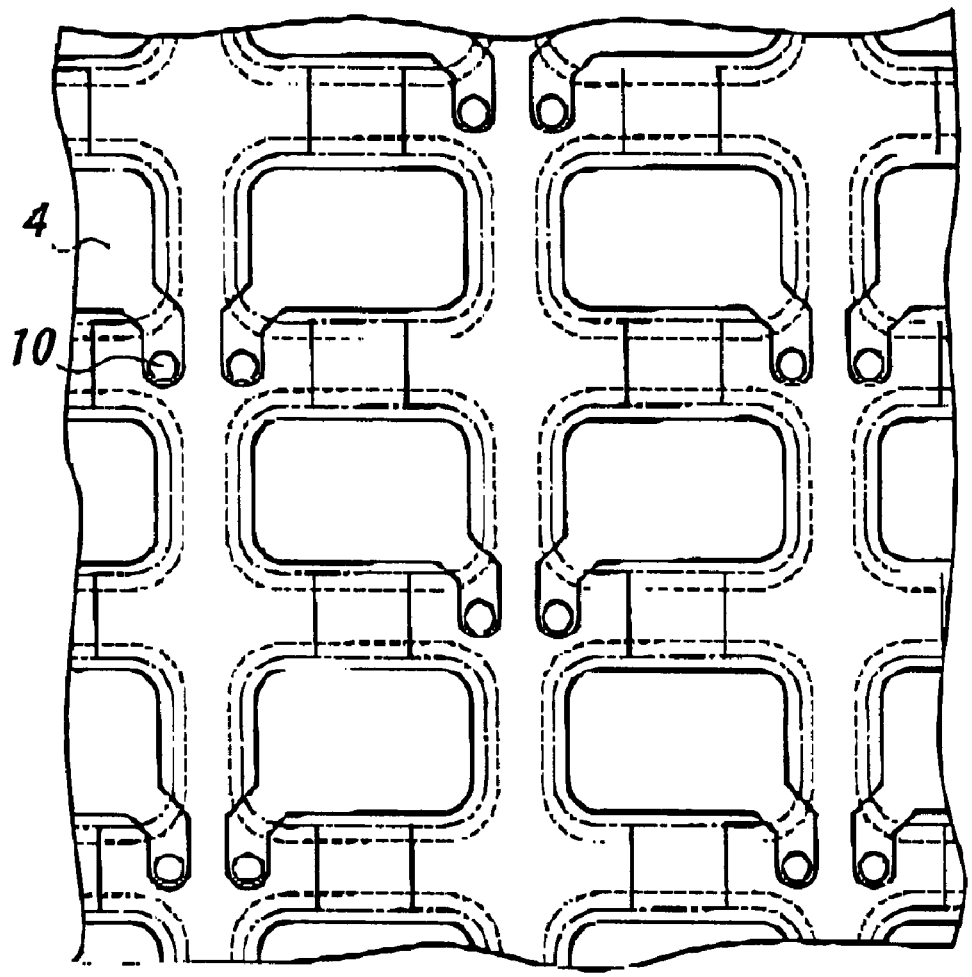
FIG. 12 is a view showing a further connecting configuration to an electrode film according to the present invention.

FIGS. 10(a) and 10(b) shows wires connected to lower electrodes 2 through through-holes 10 (illustration of an upper electrode pattern omitted), and FIG. 11 is a modification of the embodiment of FIGS. 10(a) and 10(b). FIG. 12 shows wires connected to upper electrodes 4 through through-holes 10 (illustration of a lower electrode pattern omitted).

In FIG. 10(b), reference numeral 11 denotes a window portion, 12 a spacer layer, 13 a thin planar layer forming vibrating sections, and 14 a base layer functioning as a reinforcing substrate portion and a wiring substrating portion. Opening holes are formed in the base layer 14.

Figure 13A:
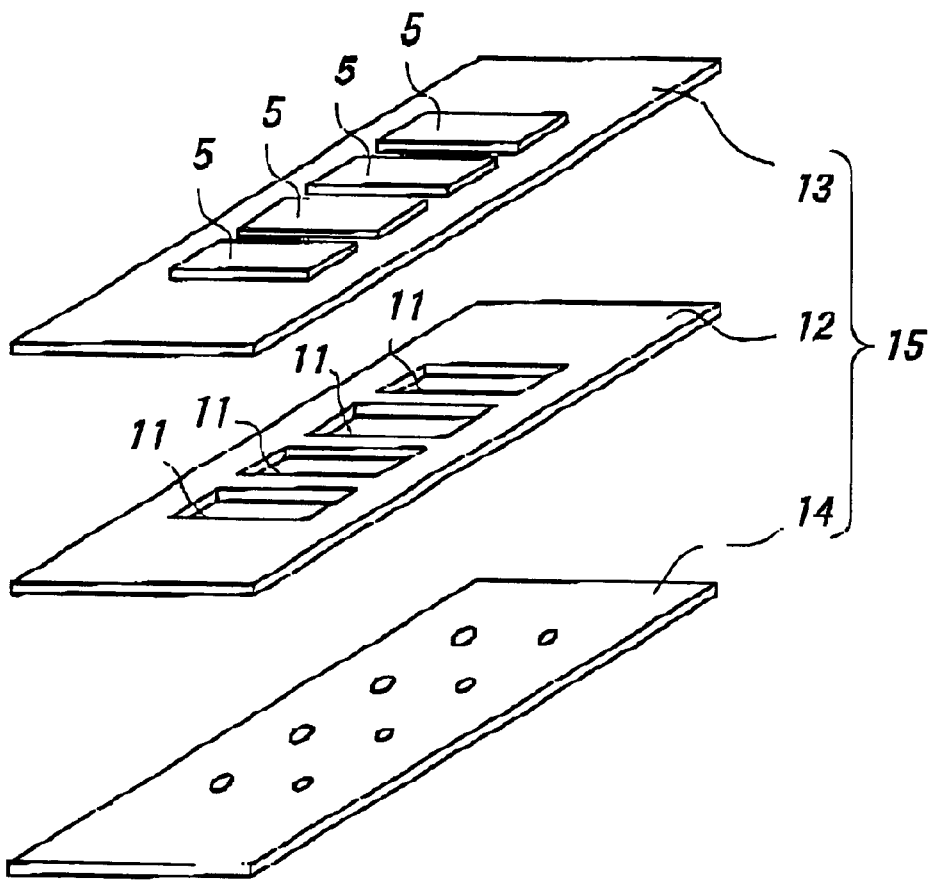
FIGS. 13(a) and 13(b) are views showing a piezoelectric/electrostrictive strictive film type actuator to which the present invention is applied.
Figure 13B:
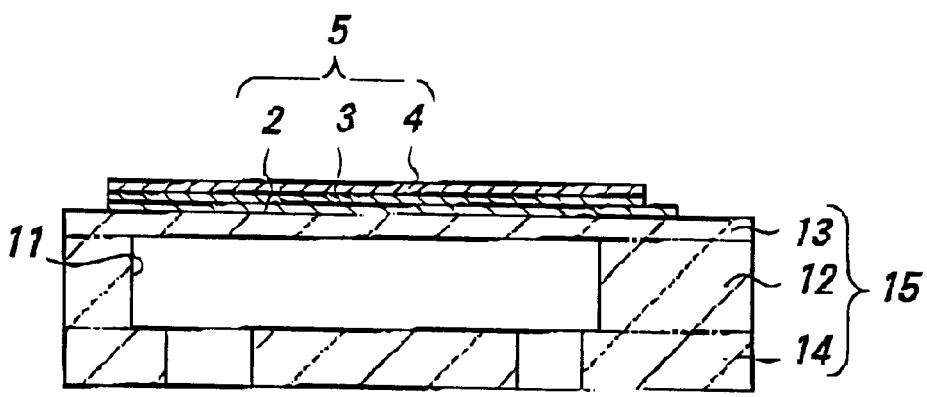

FIGS. 13(a) and 13(b) show an embodiment of a piezoelectric/electrostrictive film type actuator in which a plurality of pressurizing chambers are provided in parallel in a row, and piezoelectric/electrostrictive operating sections are provided corresponding to the respective pressurizing chambers. FIGS. 13(a) and 13(b) are a decomposed view and a sectional view of the embodiment.

In this embodiment, a spacer layer 12 in which plural windows 11 are provided in parallel in a row, a thin planar layer 13 forming a vibrating section, and a base layer 14 are laminated one upon another, and integrally fired, so that the piezoelectric/electrostrictive operating sections 5 are integrally formed with the ceramic substrate 15 having the pressurizing chambers formed with the windows 11, while located corresponding to the respective pressurizing chambers at the outer surface of the thin planar layer 13.

Figure 14A:
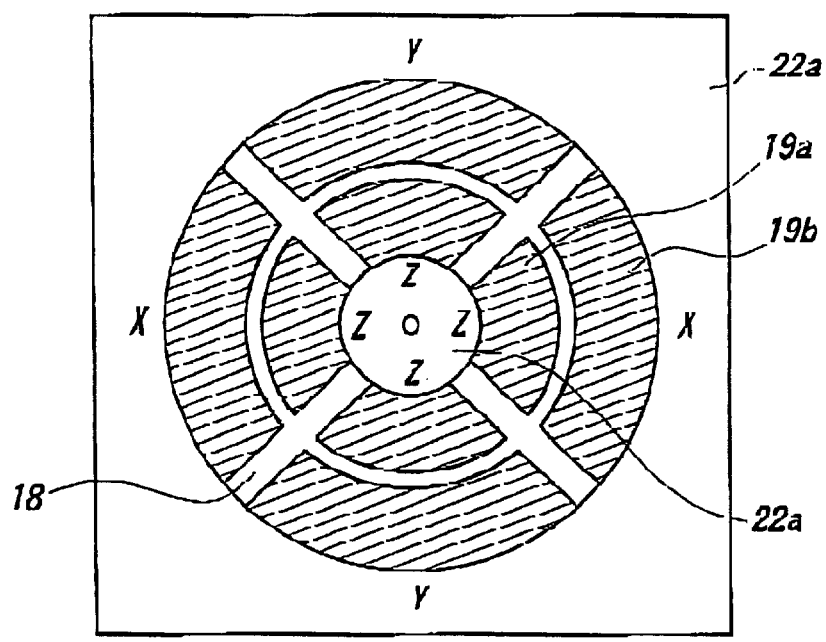
FIGS. 14(a) and 14(b) are views showing an acceleration sensor element to which the present invention is applied.
Figure 14B:
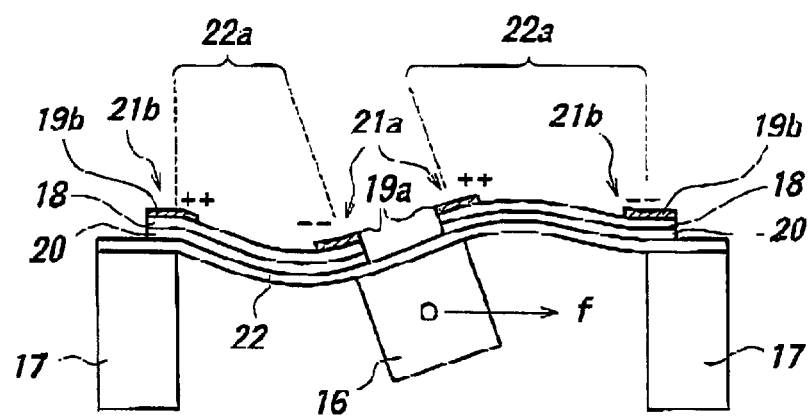

FIGS. 14(a) and 14(b) show an acceleration sensor which is constituted by a weight 16, support bases 17, and a flexible plate 22 has piezoelectric elements 21a and 21b where a piezoelectric body 18 is held between a set of electrodes 19a, 19b and 20, so that electric charges is generated from the piezoelectric body 18 depending upon bending of the flexible plate 22 corresponding to an acceleration applied from the outside, and the direction and the magnitude of the acceleration is three-dimensionally detected based such electric charges.

In this embodiment, the piezoelectric elements 21 are continuously arranged on top portions of the weight 16 and/or the support bases 17 in flexing portions 22a of the flexible plate 22.

This acceleration sensor element is produced by laminating intermittent-layered green sheets of the weight 16, the support bases 17 and the flexible plate 22, forming a laminate by compression bonding, obtaining a fired body by integrally firing the laminate, forming the piezoelectric elements 21a and 21b by a thick-film forming method and firing the resultant.

Figure 15:
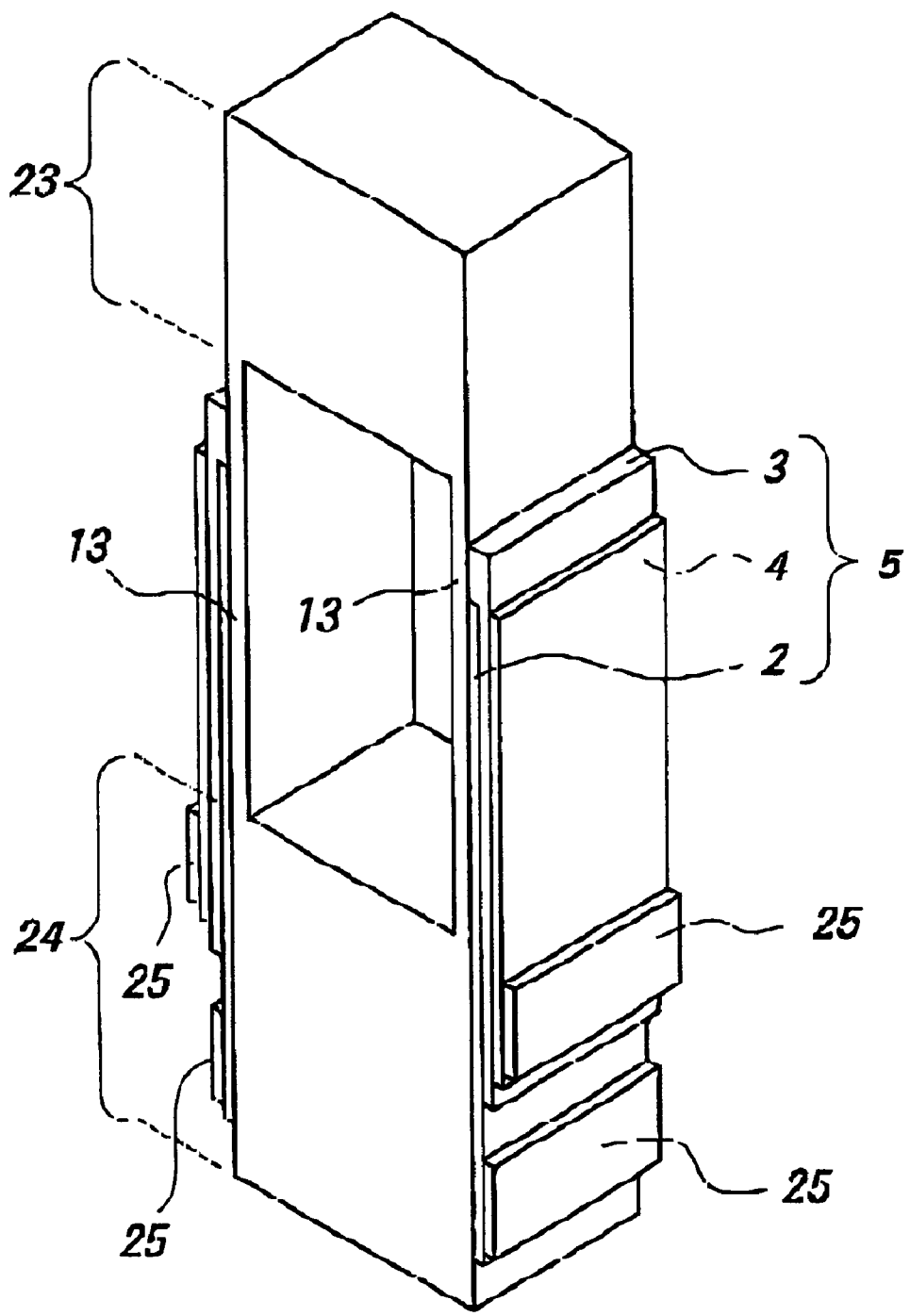
FIG. 15 is a piezoelectric/electrostrictive film type displacement element to which the present invention is applied.

FIG. 15 shows a piezoelectric/electrostrictive film type displacement element to which the present invention applied. In this figure, 23 is a movable portion, 24 a stationary portion and 25 a terminal electrode.

Next, uses of the integrated piezoelectric/electrostrictive film type elements obtained according to the present invention will be explained.

The piezoelectric/electrostrictive elements according to the present invention can be advantageously used as unimorph type elements or bimorph type elements for various transducers which convert the electric energy to the mechanical energy, that is, mechanical displacements, forces or vibrations, as well as elements for effecting reverse conversion thereof, various actuators, functional parts operating at a predetermined frequency range such as filters, various display devices such as displays, transformers, sound-emitting devices such as microphones and loudspeakers, communication and power vibrators, resonators and transmitters, magnetic head-locating elements such as hard discs, optical shutters, discriminators, various sensors such as ultrasonic sensors, accelerator sensors, angular velocity sensors, impact sensors, mass sensors and gyroscopes, and also for servo displacement elements, pulse driven motors, ultrasonic motors, piezoelectric fans, piezoelectric relays, etc., as described in Kenji Uchino, "*PIEZOELECTRIC/ELECTROSTRICTIVE ACTUATORS: FUNDAMENTAL TO APPLIED TECHNIQUES*", edited by Japan Industrial Technical Center. The piezoelectric/electrostrictive elements according to the present invention can also be advantageously adopted by various actuators, vibrators, sound-emitting devices, display devices, etc.

Since the piezoelectric/electrostrictive element according to the present invention has a dielectric property in addition to the piezoelectric/electrostrictive characteristic, it may be used as a film condenser element.

Example

A ceramic substrate was made of zirconium oxide added with 3 mol % of yttrium oxide. Green sheets for a vibrating plate (a substrate and a substrate and a surface layer) and a green sheet for a support member provided with opening holes for the formation of a 1 mm×1 mm cavity were laminated thermally compression bonded and fired at 1500° C., and then a piezoelectric/electrostrictive operating section was formed on the substrate by screen printing.

At that time, a first electrode film (lower electrode) and an upper electrode film (upper electrode) were made of platinum and gold respectively, and fired at 1300° C. and 600° C., respectively. The thickness of the electrode films were 3.0 μm and 0.5 μm, respectively. A piezoelectric/electrostrictive layer was made of a material composed mainly of lead zirconate, lead titanate and lead magnesium niobate.

The following combinations in thickness were selectively adopted between the piezoelectric/electrostrictive layer and the vibrating portion of the ceramic substrate.

(1) Piezoelectric/electrostrictive layer 10 μm thick, vibrating portion of the substrate 6 μm.
(2) Piezoelectric/electrostrictive layer 30 μm thick, vibrating portion of the substrate 15 μm.

The above piezoelectric/electrostrictive layer was fired by using a ceramic firing vessel of 150 mm×150 mm×100 mm which was spaced from a lid covering the vessel by 0 to 0.5 mm to control an open degree of the firing vessel. The same material as that of the piezoelectric/electrostrictive material was put as an evaporating source into the firing vessel in an charged amount of 0 to 50 g. The firing temperature was 1250° C.

Tables 1 and 2 give the relationship between heterophase-occurrence rate and the durability at the surface of the piezoelectric/electrostrictive layer after firing examined, and Δ: not less than 15%, less than 30%
x: not less than 30%

Warping (Warped amount of the 40 mm×40 mm substrate)
⊚: less than 15 μm
○: not less than 15%, less than 30 μm
Δ: not less than 30 μm, less than 50 μm
x: not less than 50 μm Insulating characteristic The insulating characteristic was judged based on the number of elements in which dielectric breakdown occurred when 2 kV/mm and 5 kV/mm voltages were applied, and evaluated by the following standard.

⊚: 0 elements/1000 elements
○: 1–10 elements/1000 elements
Δ: 11–100 elements/1000 elements

TABLE 1

Thickness of piezoelectric/electrostrictive layer: 10 μm
Thickness of vibrating portion of substrate: 6 μm

| No. | Heterophase occurrence rate (%) | Durability 100 h characteristic | Durability 100 h warping | Durability 300 h characteristic | Durability 300 h warping | Durability 500 h characteristic | Durability 500 h warping |
|---|---|---|---|---|---|---|---|
| 1 | 0 | Δ | Δ | X | X | fractured | fractured |
| 2 | 0.1 | ○ | ○ | ○ | ○ | ○ | ○ |
| 3 | 0.5 | ⊚ | ⊚ | ⊚ | ⊚ | ○ | ○ |
| 4 | 1 | ⊚ | ⊚ | ⊚ | ⊚ | ⊚ | ⊚ |
| 5 | 5 | ⊚ | ⊚ | ⊚ | ⊚ | ⊚ | ⊚ |
| 6 | 10 | ⊚ | ⊚ | ⊚ | ⊚ | ⊚ | ⊚ |
| 7 | 20 | ⊚ | ⊚ | ⊚ | ⊚ | ⊚ | ⊚ |
| 8 | 30 | ⊚ | ⊚ | ⊚ | ⊚ | ⊚ | ⊚ |
| 9 | 35 | ⊚ | ⊚ | ⊚ | ⊚ | ⊚ | ⊚ |

TABLE 2

Thickness of piezoelectric/electrostrictive layer: 30 μm
Thickness of vibrating portion of substrate: 15 μm

| No. | Heterophase occurrence rate (%) | Durability 100 h characteristic | Durability 100 h Warping | Durability 300 h characteristic | Durability 300 h warping | Durability 500 h characteristic | Durability 500 h warping |
|---|---|---|---|---|---|---|---|
| 1 | 0 | X | X | fractured | fractured | — | — |
| 2 | 0.1 | ○ | ○ | ○ | ○ | ○ | ○ |
| 3 | 0.5 | ⊚ | ○ | ○ | ○ | ○ | ○ |
| 4 | 1 | ⊚ | ⊚ | ⊚ | ⊚ | ⊚ | ⊚ |
| 5 | 5 | ⊚ | ⊚ | ⊚ | ⊚ | ⊚ | ⊚ |
| 6 | 10 | ⊚ | ⊚ | ⊚ | ⊚ | ⊚ | ⊚ |
| 7 | 20 | ⊚ | ⊚ | ⊚ | ⊚ | ⊚ | ⊚ |
| 8 | 30 | ⊚ | ⊚ | ⊚ | ⊚ | ⊚ | ⊚ |
| 9 | 35 | ⊚ | ⊚ | ⊚ | ⊚ | ⊚ | ⊚ |

Tables 3 and 4 also give the relationship between heterophase-occurrence rate and the insulating characteristic examined.

Durability was judged based on the charged percentage relative to the initial displacement and the warped amount for the substrate having a square shape of 40 mm×40 mm when the product was used at a temperature of 95° C. in an atmosphere with a humidity of 95% for 100 to 500 hours, and evaluated by the following standard.

Characteristic (Change percentage relative to initial displacement)
⊚: less than 10%
○: not less than 10%, less than 15%

TABLE 3

When 2 kV/mm applied

| No. | Heterophase occurrence rate (%) | Thickness of piezoelectric/electrostrictive layer 10 μm | Thickness of piezoelectric/electrostrictive layer 30 μm |
|---|---|---|---|
| 1 | 0 | ⊚ | ⊚ |
| 2 | 0.1 | ⊚ | ⊚ |
| 3 | 0.5 | ⊚ | ⊚ |

TABLE 3-continued

When 2 kV/mm applied

| No. | Heterophase occurrence rate (%) | Thickness of piezoelectric/ electrostrictive layer | |
|---|---|---|---|
| | | 10 μm | 30 μm |
| 4 | 1 | ⊙ | ⊙ |
| 5 | 5 | ⊙ | ⊙ |
| 6 | 10 | ⊙ | ⊙ |
| 7 | 20 | ○ | ○ |
| 8 | 30 | ○ | ○ |
| 9 | 35 | Δ | ○ |

TABLE 4

When 5 kV/mm applied

| No. | Heterophase occurrence rate (%) | Thickness of piezoelectric/ electrostrictive layer | |
|---|---|---|---|
| | | 10 μm | 30 μm |
| 1 | 0 | ⊙ | ⊙ |
| 2 | 0.1 | ⊙ | ⊙ |
| 3 | 0.5 | ⊙ | ⊙ |
| 4 | 1 | ⊙ | ⊙ |
| 5 | 5 | ⊙ | ⊙ |
| 6 | 10 | ⊙ | ⊙ |
| 7 | 20 | ○ | ○ |
| 8 | 30 | ○ | ○ |
| 9 | 35 | Δ | Δ |

As shown in Tables 1 and 2, there is a strong relationship between the heterophase-occurrence rate at the surface of the piezoelectric/electrostrictive layer and the durability. When the heterophase-occurrence rate is not less than 0.1%, excellent durability is obtained. Particularly, when the heterophase-occurrence rate is not less than 1%, extremely excellent durability is obtained.

As shown in Tables 3 and 4, there is also a strong relationship between the heterophase-occurrence rate at the surface of the piezoelectric/electrostrictive layer and the insulating characteristic. When the heterophase-occurrence rate is not more than 30%, excellent insulation characteristic is obtained. Particularly, when the heterophase-occurrence rate is not more than 10%, extremely excellent insulation characteristic is obtained.

Since firing is conventionally effected under such condition to suppress as much as evaporation of lead from the piezoelectric/electrostrictive layer on firing, the heterophase-occurrence rate is almost zero after the firing. Accordingly, no problem occurred in the piezoelectric/electrostrictive characteristic and the insulation characteristic, but durability was inevitably conspicuously deteriorated.

Figure 16:
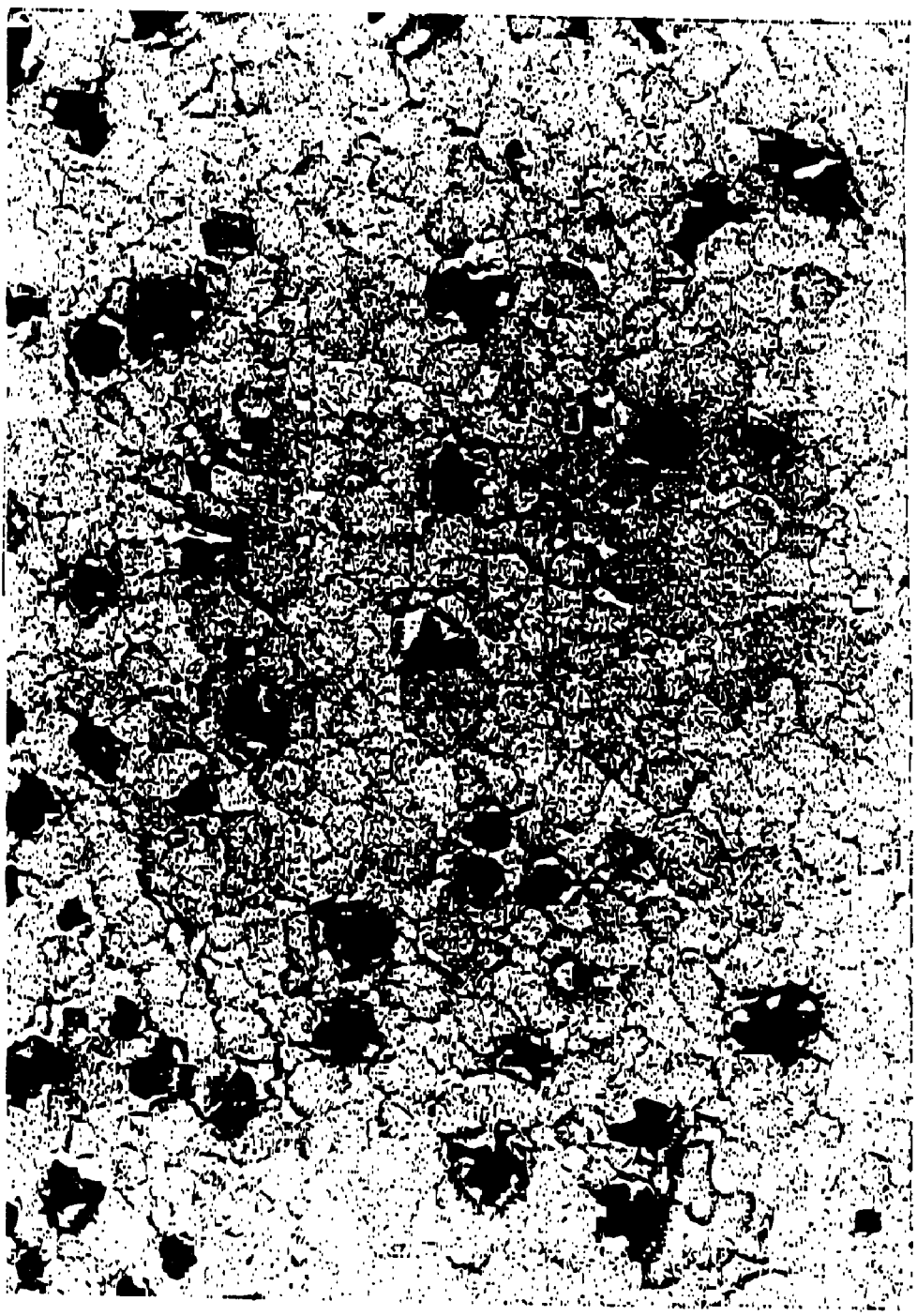
FIG. 16 is a reflection electron image photograph of a surface of a piezoelectric/electrostrictive layer with a scanning electron microscope.

FIG. 16 shows a reflective electron image in the observation of a surface of the piezoelectric/electrostrictive layer after the filing with a scanning electron microscope. As seen from FIG. 16, the heterophase portion has a relatively dark image, and can be easily discriminated. The heterophase-occurrence rate in this case was 5%.

As mentioned above, the present invention enables the stable production of the piezoelectric/electrostrictive element which exhibits excellent durability and excellent piezoelectric/electrostrictive characteristic, even when the integrated piezoelectric/electrostrictive film type element is used in a high-temperature and highly humid atmosphere.

What is claimed is:

1. An integrated piezoelectric/electrostrictive film type element having excellent durability and comprising a substrate made of a ceramic material composed mainly of completely stabilized or partially stabilized zirconium oxide, and a piezoelectric/electrostrictive operating section integrated onto the ceramic substrate by a film-forming method, said piezoelectric/electrostrictive operating section comprising a lower electrode, a piezoelectric/electrostrictive layer of a lead element-containing comprising, and an upper electrode, wherein a heterophase-occurrence rate at a surface of the piezoelectric/electrostrictive layer is controlled to within a range of 0.1 to 30%.

2. The integrated piezoelectric/electrostrictive film type element according to claim 1, wherein the ceramic substrate comprises a thin diaphragm portion, and said piezoelectric/electrostrictive operating section is integrally formed on an outer surface of the diaphragm portion.

3. The integrated piezoelectric/electrostrictive film type element according to claim 1, wherein the heterophase-occurrence rate is controlled to within a range of 1 to 10%.

4. The integrated piezoelectric/electrostrictive film type element according to claim 1, wherein the average grain size of crystals constituting the ceramic substrate is 0.1 to 2.0 μm.

5. The integrated piezoelectric/electrostrictive film type element according to claim 1, wherein a thickness of the piezoelectric/electrostrictive layer is not more than 100 μm.

6. The integrated piezoelectric/electrostrictive film type element according to claim 1, wherein the thickness of the piezoelectric/electrostrictive layer is not more than 150 μm.

7. The integrated piezoelectric/electrostrictive film type element according to claim 2, wherein a thickness of the diaphragm portion is not more than 50 μm.

8. The integrated piezoelectric/electrostrictive film type element according to claim 2, wherein a thickness of the piezoelectric/electrostrictive layer is not more than 100 μm.

9. The integrated piezoelectric/electrostrictive film type element according to claim 2, wherein a thickness of the piezoelectric/electrostrictive operating section is not more than 150 μm.

10. The integrated piezoelectric/electrostrictive film type element according to claim 2, wherein the heterophase-occurrence rate is controlled to within a range of 1 to 10%.

11. The integrated piezoelectric/electrostrictive film type element according to claim 2, wherein the average grain size of crystals constituting the ceramic substrate is 0.1 to 2.0 μm.

* * * * *

UNITED STATES PATENT AND TRADEMARK OFFICE
CERTIFICATE OF CORRECTION

PATENT NO.    : 6,518,690 B2
DATED         : February 11, 2003
INVENTOR(S)   : Yukihisa Takeuchi et al.

It is certified that error appears in the above-identified patent and that said Letters Patent is hereby corrected as shown below:

<u>Title page,</u>
Item [56], References Cited, OTHER PUBLICATIONS, please add:

-- U.S. patent application Ser. No. 09/861,738, Takeuchi et al., filed May 21, 2001. --

Item [57], ABSTRACT, please replace ABSTRACT in its entirety and replace with the following ABSTRACT:

-- An integrated piezoelectric/electrostrictive film type element having excellent durability includes a substrate made of a ceramic material composed mainly of completely stabilized or partially stabilized zirconium oxide. A piezoelectric/ electrostrictive operating section is intergrated onto the ceramic substrate by a film-forming method. The piezoelectric/electrostrictive operating section includes a lower electrode, a piezoelectric/electrostrictive layer of a lead element-containing composition, and an upper electrode. A heterophase-occurence rate at a surface of the piezoelectric/ electrostrictive layer is controlled to be within a range of 0.1 to 30%. --

Signed and Sealed this

Third Day of June, 2003

JAMES E. ROGAN
*Director of the United States Patent and Trademark Office*